United States Patent
Lebourg et al.

(10) Patent No.: US 6,879,506 B2
(45) Date of Patent: Apr. 12, 2005

(54) NON-VOLATILE READ-ONLY MEMORY MODIFIABLE BY REDEFINITION OF A METAL OR VIA LEVEL

(75) Inventors: Philippe Lebourg, Saint Paul de Varces (FR); Davide Tesi, Ferney-Voltaire (FR)

(73) Assignee: STMicroelectronics S.A., Montrouge (FR)

(*) Notice: Subject to any disclaimer, the term of this patent is extended or adjusted under 35 U.S.C. 154(b) by 30 days.

(21) Appl. No.: 10/427,713

(22) Filed: May 1, 2003

(65) Prior Publication Data

US 2003/0214863 A1 Nov. 20, 2003

(30) Foreign Application Priority Data

May 2, 2002 (FR) .............................................. 02 05517

(51) Int. Cl.[7] .......................... G11C 17/16; G11C 5/06; G11C 5/02
(52) U.S. Cl. .............................. 365/63; 365/96; 365/51; 365/94
(58) Field of Search ........................... 365/63, 96, 105, 365/175, 100, 51, 94

(56) References Cited

U.S. PATENT DOCUMENTS

| | | | |
|---|---|---|---|
| 5,196,362 A | * | 3/1993 | Suzuki .................... 438/599 |
| 5,926,417 A | | 7/1999 | Chang |
| 6,292,024 B1 | * | 9/2001 | Jensen et al. ................ 326/47 |
| 6,304,480 B1 | | 10/2001 | Schoellkopf |
| 2001/0011909 A1 | | 8/2001 | Jensen et al. |

* cited by examiner

Primary Examiner—Michael S. Lebentritt
Assistant Examiner—J. H. Hur
(74) Attorney, Agent, or Firm—Lisa K. Jorgenson; James H. Morris; Wolf, Greenfield & Sacks, P.C.

(57) ABSTRACT

A memory element in an integrated circuit includes several levels of conductive materials separated by insulating levels, each of which is capable of being crossed by conductive vias of an intercalary via level, and at least two connection rails, including several assemblies of successive interconnected areas and vias, a first assembly being formed of a zigzag running from a first metal level to a last metal level and back to the first metal level between a first end and a second end, each of the other assemblies being connected to one of the connection rails, the first end of the zigzag being connected to an initial assembly among the other assemblies.

11 Claims, 9 Drawing Sheets

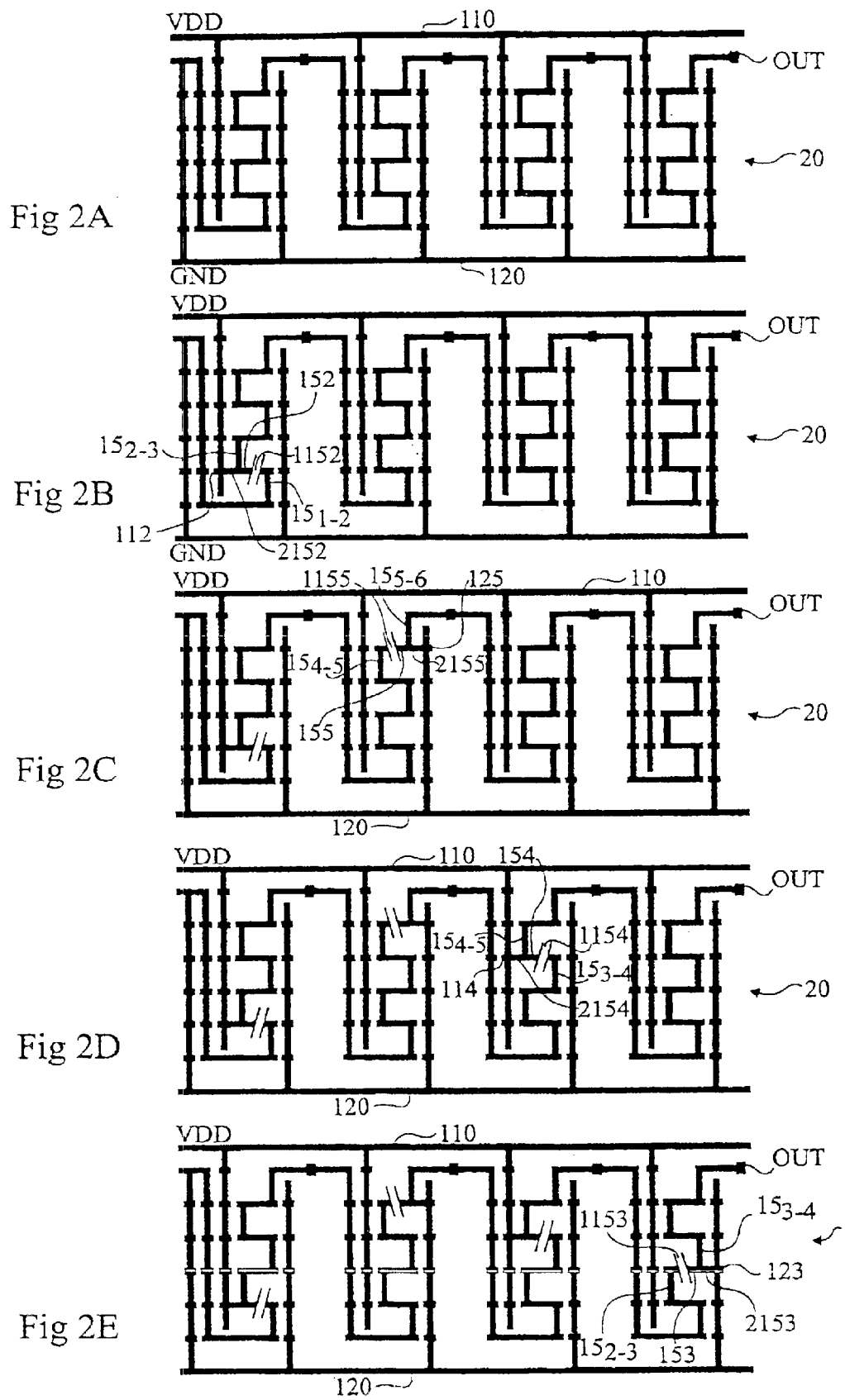

NON-VOLATILE READ-ONLY MEMORY MODIFIABLE BY REDEFINITION OF A METAL OR VIA LEVEL

BACKGROUND OF THE INVENTION

1. Field of the Invention

The present invention generally relates to integrated circuits, and more specifically to a memory point formed over several metal and via levels that can be reprogrammed by modification of any metal or via level.

2. Discussion of the Related Art

Integrated circuits are increasingly complex and it is often necessary to modify a circuit several times after testing and evaluation by the user. Currently, there can be from three to ten successive versions of the same circuit. From one version to another, the circuit modifications are conventionally performed by redefining the metal connections on a single metal level or a single via level.

It is desirable to be able to indicate to which version a given circuit belongs. This can be done by marking the chip or the package. These two solutions raise problems of manufacturing and use. Solutions enabling, by an electric testing, determination of the version, require providing a storage means in the circuit that can be updated upon successive modifications of the circuit. However, known conventional means are not adapted to be simply modified upon redefinition of a single metal level or of a single via level.

SUMMARY OF THE INVENTION

An object of the present invention is to provide a read-only non-volatile memory that can be reprogrammed by modification of any metal or via level.

To achieve this object and others, the present invention provides a memory element in an integrated circuit comprised of several levels of conductive materials separated by insulating levels, each of which is likely to be crossed by conductive vias of an intercalary via level, and at least two connection rails, and comprising several assemblies of successive interconnected areas and vias, a first assembly being formed of a zigzag running from a first metal level to a last metal level and back to the first metal level between a first end and a second end, each of the other assemblies being connected to one of the connection rails, the first end of the zigzag being connected to an initial assembly among the other assemblies.

According to an alternative embodiment of the previously-described memory element, the zigzag is cut once and connected once to one of the other assemblies different from the initial assembly, the cut being on the side of the first end, and the connection on the side of the second end, the cut and the connection being performed on a same metal level or a same via level.

The present invention provides a memory point comprising a plurality of memory elements, such as previously defined, in series, the second end of a memory element being connected to the first end of the next memory element.

The present invention also provides a memory comprising one or several memory points such as previously defined.

Further, the present invention provides a method for programming a memory point in an integrated circuit comprising several levels of conductive materials separated by insulating levels, each of which is likely to be crossed by conductive vias of an intercalary via level, and at least two connection rails, the memory point comprising at least two assemblies of interconnected areas and vias, a first assembly being formed of n zigzags in series, n being a number greater than or equal to 1, each zigzag running from a first metal level to a last metal level and back to the first metal level between a first end and a second end, the second end of each zigzag being connected to the first end of the next zigzag, each of the other assemblies being connected to one of the connection rails, the first end of the first zigzag being connected to an initial assembly selected from among the other assemblies, and comprising:

a first programming at the level of the first zigzag in two steps:

cutting the zigzag in two parts, and connecting the zigzag part connected to the second end to one of the other assemblies different from the initial assembly;

a second programming at the level of the second zigzag or possibly of the first zigzag in two steps:

cutting the zigzag in two parts, and connecting the zigzag part connected to the second end to one of the other assemblies different from that used for the previous programmation;

successive programming of one or several zigzags, to the n-th zigzag according to the second programming.

According to an embodiment of the memory element according to the present invention, a first part of the zigzag is formed of i+1 metal areas and of i vias superposed between the first and last metal levels, the upper area on the upper metal level being connected to the first end, and a second stepped part of the zigzag is formed of i+1 metal areas and of i vias between the first and last metal levels, two vias on consecutive via levels being arranged on either side of the area defined on the intermediary metal level, the upper area being connected to the second end of the zigzag, the lower areas, on the first metal level, of the first and second parts of the zigzag being connected, and in which second and third assemblies are arranged on either side of the zigzag and are both formed of i−1 columns of decreasing sizes formed of areas and vias superposed between the last metal level and a metal level, from the first to the i-th metal level, the i−1 lower areas of each column covering a portion of the i−1 areas of the second part of the zigzag respectively defined on the metal levels ranging from the first metal level to metal level i−2, the i−1 columns being connected together by a rail defined on the i-th metal level, the upper area of the first part of the zigzag being connected to the rail of the second or of the third assembly.

According to an alternative embodiment of the memory element such as described hereabove, the first part of the zigzag is cut by removal of a via and the second part of the zigzag is connected to one of the first and second assemblies by addition of a via, on the same via level, between one of the areas of the second part of the zigzag and the lower area of one of the columns covering said area.

According to another alternative embodiment of the memory element such as described hereabove, one of the areas of the second part of the zigzag is cut, the portion of this area on the side of the second end of the zigzag is connected to the lower area of one of the columns defined on the same metal level.

According to another embodiment of a memory element according to the present invention, a first part of the zigzag is formed of a column of areas and of vias superposed between the first and last metal levels, the upper area being connected to the end of the zigzag, a second part of the zigzag is formed of i+1 rectilinear metal areas defined on all metal levels, from the first to the last, and of i vias defined on all via levels, connected together to the shape of an ascending spiral, the rectilinear areas defined on the even metal levels being oriented according to a first direction, those defined on the odd metal levels being oriented according to a second direction perpendicularly to the first direction, the upper area of the second part of the zigzag being connected to the second end of the zigzag, the lower areas, on the first metal level, of the first and second parts of the zigzag being connected, and in which second and third assemblies are both formed of first superposed rectilinear rails defined on each of the even metal levels and oriented according to the first direction, and of second superposed rectilinear rails defined on each of the odd metal levels and oriented according to the second direction, the first and second rails of a same assembly being connected by vias, the rails oriented according to the first or the second direction respectively passing under or over the areas of the second part of the zigzag respectively oriented according to the second or to the first direction.

According to an alternative embodiment of the memory element such as described hereabove, the first part of the zigzag is cut by removal of a via and the second part of the zigzag is connected to one of the second and third assemblies by addition of a via, on the same via level, between one of the areas of the second part of the zigzag and the rail of one of the second and third assemblies passing over this area.

According to another alternative embodiment of the memory element such as described hereabove, one of the areas of the second part of the zigzag is cut, the portion of this area on the side of the second end of the zigzag is connected to the rail of one of the second and third assemblies defined on the same metal level.

The foregoing object, features, and advantages of the present invention, will be discussed in detail in the following non-limiting description of specific embodiments in connection with the accompanying drawings.

BRIEF DESCRIPTION OF THE DRAWINGS

FIG. 2A is a simplified representation of a memory point according to the present invention;

FIGS. 2B, 2C, 2D, and 2E respectively illustrate the programming of the first, second, third, and fourth primary structures of the memory point of FIG. 2A;

DETAILED DESCRIPTION

Figure 1:
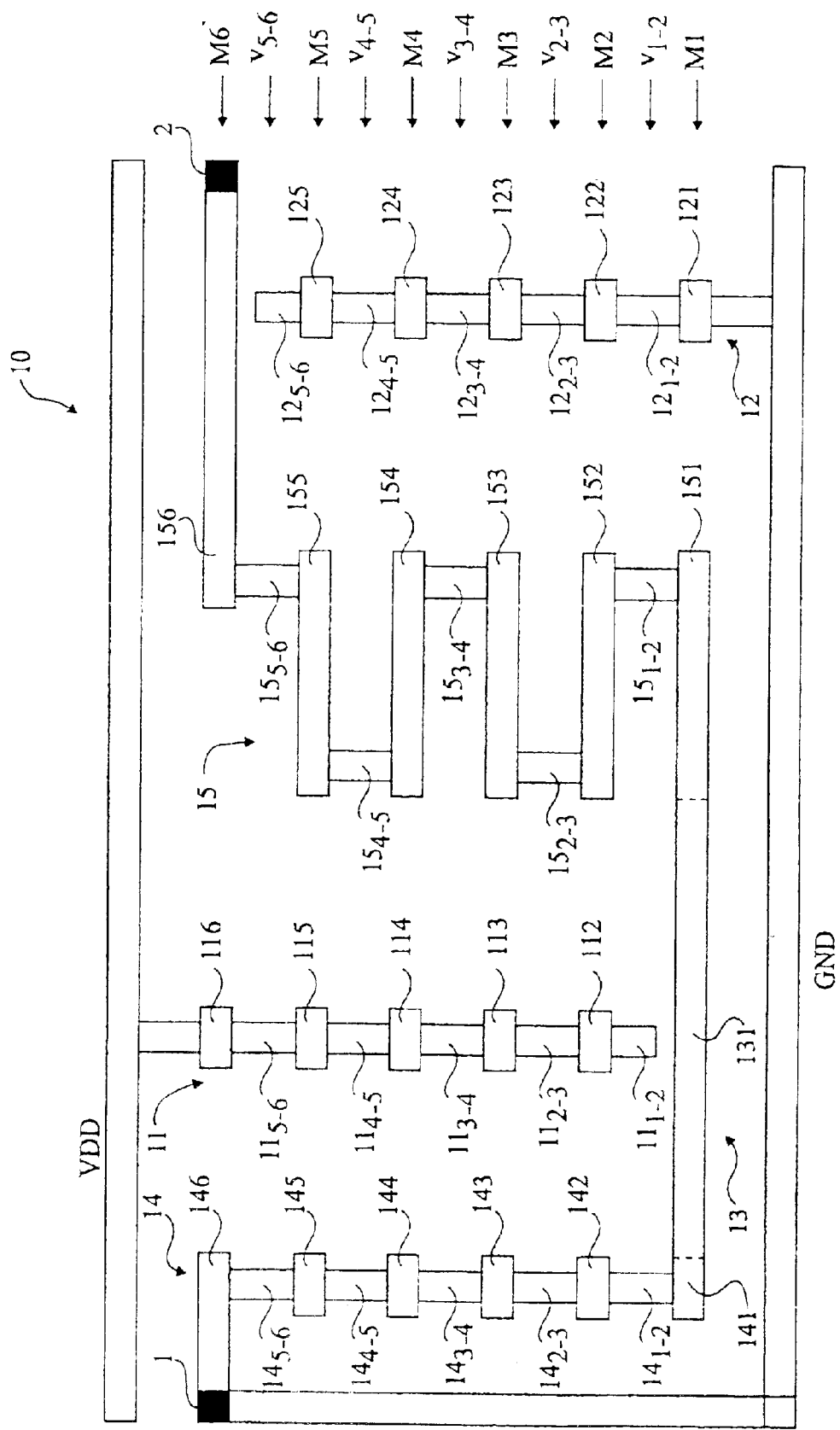
FIG. 1 is a simplified cross-section view of a primary memory point structure according to the present invention.

FIG. 1 is a simplified cross-section view of a primary structure 10 of a memory point according to the present invention. The memory point belongs to an integrated circuit comprising several levels of conductive materials called metal levels ($M_1$ to $M_i$). Each metal level is separated by an insulating layer. A via level enables performing connections between conductive lines formed on adjacent metal levels. Each via level between two adjacent metal levels $M_z$ and $M_{(z+1)}$ will be designated as "$V_{z-(z+1)}$", z being an integer comprised between 1 and i-1. As an example, six metal levels $M_1$ to $M_6$ and 5 via levels $v_{1-2}$ to $v_{5-6}$ are used in the examples of implementation discussed hereafter.

Primary structure 10 comprises first 11, second 12, and third 13 assemblies of interconnected metal areas and vias. The first assembly is formed of 6 metal areas 111 to 116, respectively on metal levels $M_1$ to $M_6$, and of 5 superposed vias $11_{1-2}$ to $11_{5-6}$, respectively on via levels $v_{1-2}$ to $v_{5-6}$, substantially in a column. For clarity, area 111 is not shown and via $11_{1-2}$ is shortened. The second assembly is formed of 6 metal areas 121 to 126, respectively on metal levels $M_1$ to $M_6$, and of 5 superposed vias $12_{1-2}$ to $12_{5-6}$, respectively on via levels $v_{1-2}$ to $v_{5-6}$, substantially in a column. For clarity again, area 126 is not shown and via $12_{5-6}$ has been shortened. The first and second assemblies may be connected to terminals internal or external to the integrated circuit or be respectively connected to high (VDD) and low (GND) terminals of a power supply, such as illustrated in FIG. 1.

Third assembly 13 forms a zigzag between a first end 1 and a second end 2, running from upper metal level $M_6$ to lower metal level $M_1$, and back to upper metal level $M_6$. A first part 14 of the zigzag, on the side of end 1, is formed of 6 metal areas 141 to 146, respectively on metal levels $M_1$ to $M_6$, and of 5 superposed vias $14_{1-2}$ to $14_{5-6}$, respectively on via levels $v_{1-2}$ to $v_{5-6}$. A second part 15 of the zigzag, on the side of end 2, is formed of 6 metal areas 151 to 156, respectively on metal levels $M_1$ to $M_6$ and of 5 vias $15_{1-2}$ to $15_{5-6}$, respectively on via levels $v_{1-2}$ to $v_{5-6}$.

In second part 15 of the zigzag, metal areas 151 to 155 are of same sizes and are superposed. Vias $15_{1-2}$ to $15_{5-6}$ are alternately arranged on the right-hand side and on the left-hand side of metal areas 151 to 155. Areas 151 to 155 are sufficiently wide to avoid superposition of the two vias connected to each of the areas, for example, vias $15_{2-3}$ and $15_{3-4}$ for area 153. Area 156 is connected to end 2 of the zigzag. Areas 141, and 151 respectively of the first and of the second-part of the zigzag are connected by an area 131 formed on metal level $M_1$.

First assembly 11 is arranged between the first and second parts of the zigzag. The second assembly is arranged to the right of the second part of the zigzag. Thus, metal area 131, connecting the two parts of the zigzag, runs next to metal area 111 of first assembly 11 (connected to VDD). Area 156 of second part 15 of the zigzag runs next to metal area 126 of second assembly 12 (connected to GND).

Area 116 of the column of first assembly 11 is connected to a horizontal line drawn above the previously-described drawing, this line symbolically representing a connection rail connected in this example to terminal VDD. Similarly, the second assembly is connected to a horizontal connection rail positioned under the drawing and connected to terminal GND in this example. Generally, the programming of the primary memory point structure such as described hereabove is performed by connecting the zigzag, or third assembly 13, to one of the first and second assemblies (11, 12). The programmed value can be read from second end 2 of the zigzag.

The primary structure is initially programmed. For this purpose, first end 1 of the zigzag is connected to one of the first and second assemblies. In the example of FIG. 1, the primary structure is initially programmed to GND. The primary structure may be afterwards programmed to VDD (or to GND in the case of an initial programmation to VDD) as will be described hereafter.

FIG. 2A is a simplified cross-section view of a memory point according to the present invention, comprising n primary structures such as that illustrated in FIG. 1, n being an integer greater than or equal to one. The memory point illustrated in FIG. 2A comprises 4 primary structures. Second end 2 of the zigzag of one primary structure is connected to first end 1 of the zigzag of the next primary structure. The first assemblies 11 of each structure are interconnected by a first rail 110, connected to VDD. The second assemblies 12 of each structure are also interconnected by a second rail 120, connected to GND. First end 1 of the first zigzag (the zigzag of the first primary structure) is connected to one of the two rails 110, 120, for example, to GND. Second end 2 of the last zigzag forms output OUT of the memory point. The value of the memory point is the value that can be read from output OUT. Thus, initially, output OUT is at GND, in the chosen example.

FIGS. 2B, 2C, 2D, 2E illustrate successive programmings of the memory point, by programming respectively of the first, second, third, and fourth primary structures forming the memory point.

FIG. 2B illustrates a first programming of the memory point by modification of metal level $M_2$. A cut 1152 in metal area 152 of the second part of the first zigzag is performed between via $15_{1-2}$ and via $15_{2-3}$. A metal area 2152 on metal level $M_2$ is added between the left-hand portion of area 152 and area 112 of the first assembly at VDD of the first structure. Thus, after this first programming, the value stored in the memory point is VDD.

FIG. 2C illustrates a next programming of the same memory point performed by a modification in metal level $M_5$. This second programming is performed on the second primary structure of the memory point. A cut 1155 in area 155 of the second part of the second zigzag of the memory point is performed between vias $15_{4-5}$ and $15_{5-6}$. A metal area 2155 is added to connect the right-hand portion of area 155, on the side of the second end of the zigzag, to area 125 of the second assembly (GND) of the second primary structure. Output OUT is thus connected to GND.

It should be noted that in the considered example, the second programming could be performed without using the second zigzag since it is possible to cut the second part of the first zigzag and then connect the second end of this zigzag to the second assembly (GND) by modifying metal level $M_5$.

FIG. 2D illustrates a third programming of the memory point, at the level of the third primary structure thereof, performed by a modification in metal level $M_4$. A cut 1154 is performed in area 154 of the second part of the third zigzag between via $15_{3-4}$ and via $15_{4-5}$. A metal area 2154 on the corresponding level $M_4$ is added and enables connecting the left-hand portion of area 154 to area 114 of the first assembly (VDD) of the third structure. Output OUT is thus connected to VDD.

It should be noted that this third programming on metal level $M_4$ must necessarily be performed on the third primary structure. Indeed, the previous programming having been performed on metal level $M_5$, a cut and a connection of area 154 of the second structure to the first assembly (VDD) would not change the voltage applied to output OUT.

Generally, it is possible to perform a new programming on a primary structure already programmed on a given metal level if the area of the second part of the zigzag defined on this metal level is still connected to the second end of the primary structure and thus to output OUT.

FIG. 2E illustrates a fourth programming of the memory point performed on the fourth structure of the memory point by modification of metal level $M_3$. A cut 1153 in area 153 of the second part of the fourth zigzag is performed between vias $15_{2-3}$ and $15_{3-4}$. A metal area 2153 is added on metal level $M_3$ connecting the right-hand portion of area 153 of the fourth zigzag to area 123 of the second assembly (GND) of the fourth structure. Output OUT is thus connected to GND.

According to a major aspect of the present invention, it should be noted that the programming of each of the primary structures could have been performed similarly on any of the 6 metal levels. Thus, this programming can be performed at the same time as the alteration of any metal level to form a new version of an integrated circuit. A version number can thus, in particular, be coded in a desired manner by providing several memory points such as that described previously, the programming of one or several of these memory points being modified for each alteration.

According to another major aspect of the present invention, it should be noted that the programming of a primary memory point structure could have been performed similarly by modification of any of the 5 via levels. This will be explained in relation with FIGS. 3A to 3C.

Figure 3A:
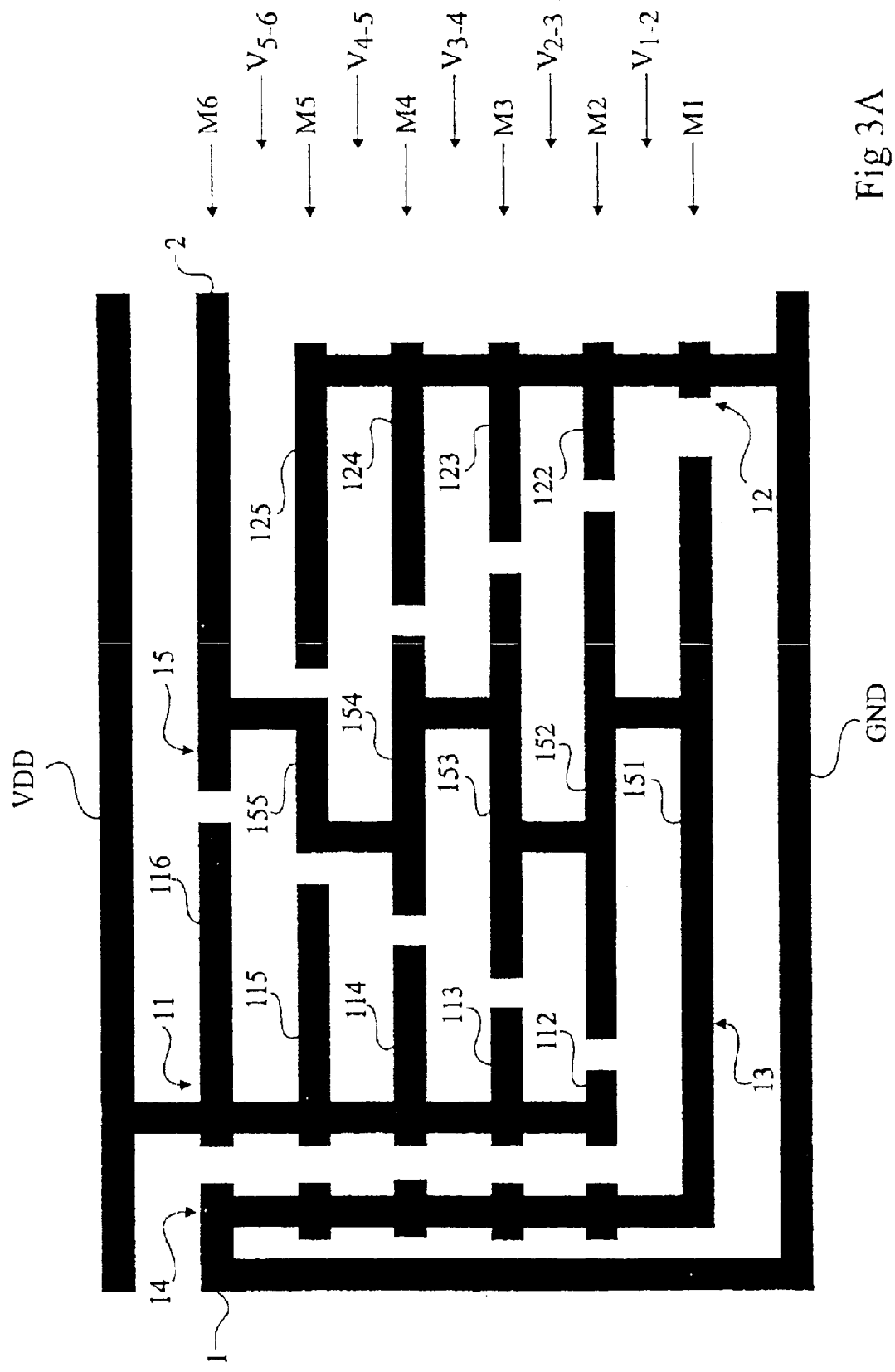
FIG. 3A is a more detailed simplified cross-section view of a primary memory point structure according to the present invention.

FIG. 3A is a more detailed simplified cross-section of a primary memory point structure. In this drawing, the elements analogous to those of FIG. 1 are designated with same reference numerals. However, to simplify the representation, many reference numerals are omitted. The main differences with FIG. 1 are indicated hereafter. Metal areas 151 to 155 of the second part of the zigzag have been lengthened, symmetrically, to the left and to the right. The size of each area progressively decreases from metal level $M_1$ to metal level $M_5$. Thus, area $M_1$ is larger than area $M_2$, which is itself larger than area $M_3$, and so on. Metal areas 112 to 116, and 122 to 126 of the first and second assemblies have been respectively lengthened to the right and to the left, the lengthening increasing with the metal level. The right-hand portion of a metal area of the first assembly (VDD) on a metal level $M_k$ is above the left-hand portion of the metal area of the second part of the zigzag defined on a metal level $M_{k-1}$. Thus, for example, the right-hand portion of area 113 (VDD) is above the left-hand portion of area 152. Similarly, the left-hand portion of a metal area of the second assembly (GND) on a metal level $M_k$ is above the right-hand portion of a metal area of the second part of the zigzag defined on metal level $M_{k-1}$. In FIG. 3A, as in FIG. 1, the memory point structure is initially programmed by connection of end 1 of the zigzag to the rail connected to GND.

Figure 3B:
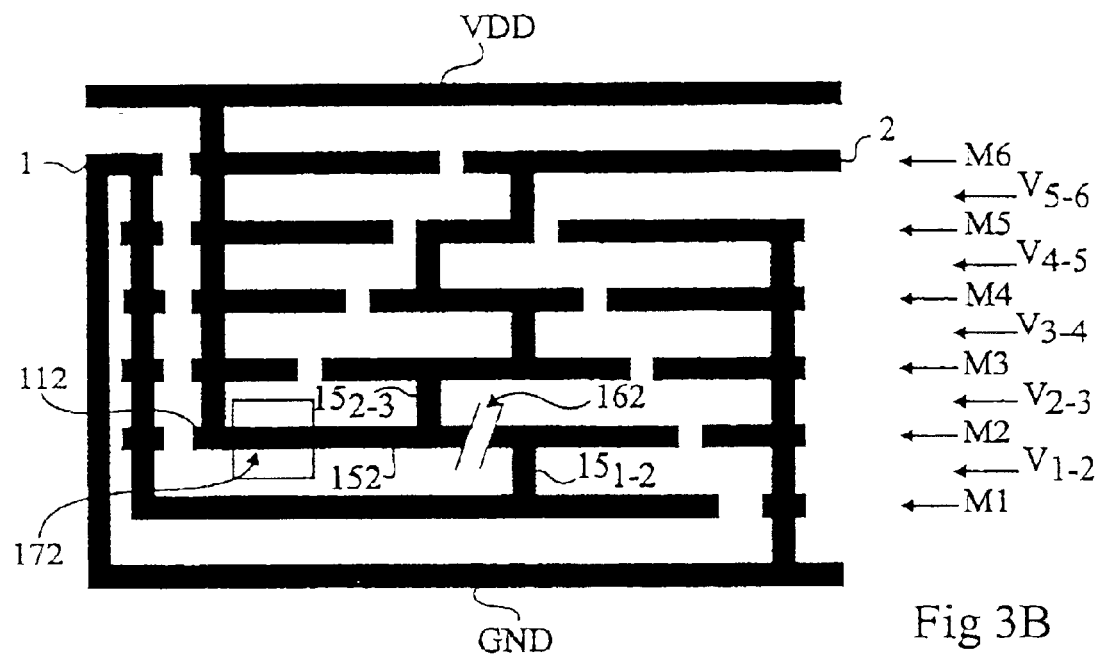
FIG. 3B illustrates the programming by modification of a metal level of a primary memory point structure according to the present invention.

FIG. 3B, like FIG. 2B, illustrates a programming by modification of metal level $M_2$. An opening 162 in area 152 is performed between vias $15_{1-2}$ and $15_{2-3}$. A metal area 172 is added and connects area 112 of the first assembly (VDD)

to the left-hand portion of area 152. The zigzag piece connected to end 2 is thus now connected to first terminal VDD.

Figure 3C:
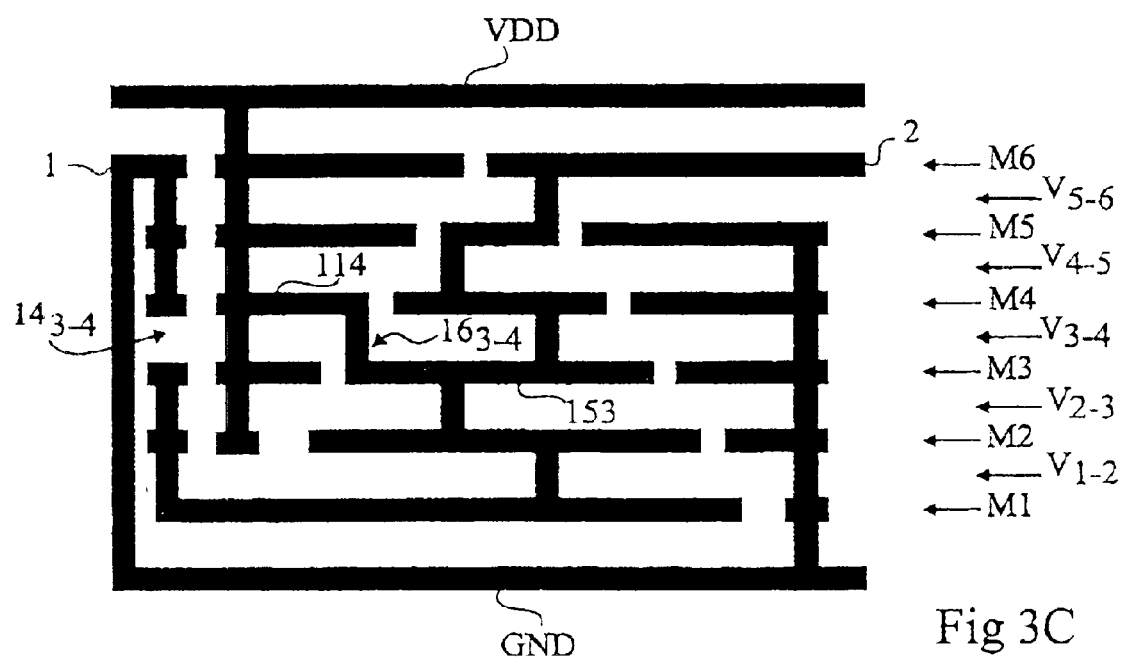
FIG. 3C illustrates the programming by modification of a via level of a primary memory point structure according to the present invention.

FIG. 3C illustrates the fact that the programming may as well be performed by modification of a via level. Via $14_{3-4}$ of the first part of the zigzag has been removed. A via $16_{3-4}$, on via level $v_{3-4}$, is added. Via $16_{3-4}$ is arranged on the left-hand side of area 153 of the second part of the zigzag and on the right-hand side of area 114 of the first assembly (VDD). As with the programming on a metal level described hereabove, the zigzag is cut in two pieces and the piece connected to second end 2 of the zigzag is connected to VDD. The stored value switches from GND, chosen as the initial value, to VDD.

Figure 4A:
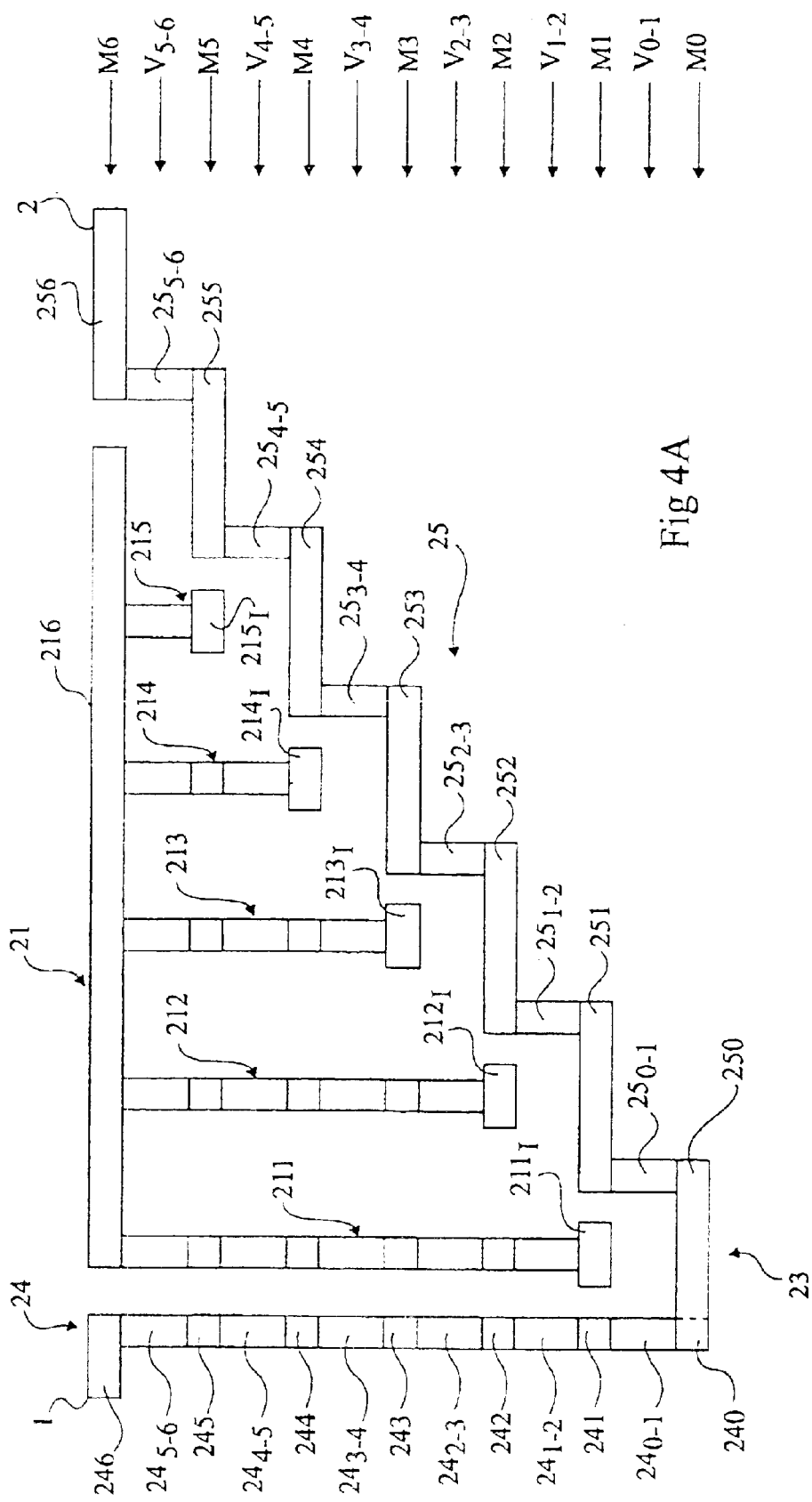
FIG. 4A is a cross-section view of a primary memory point structure according to another embodiment of the present invention.
Figure 4B:
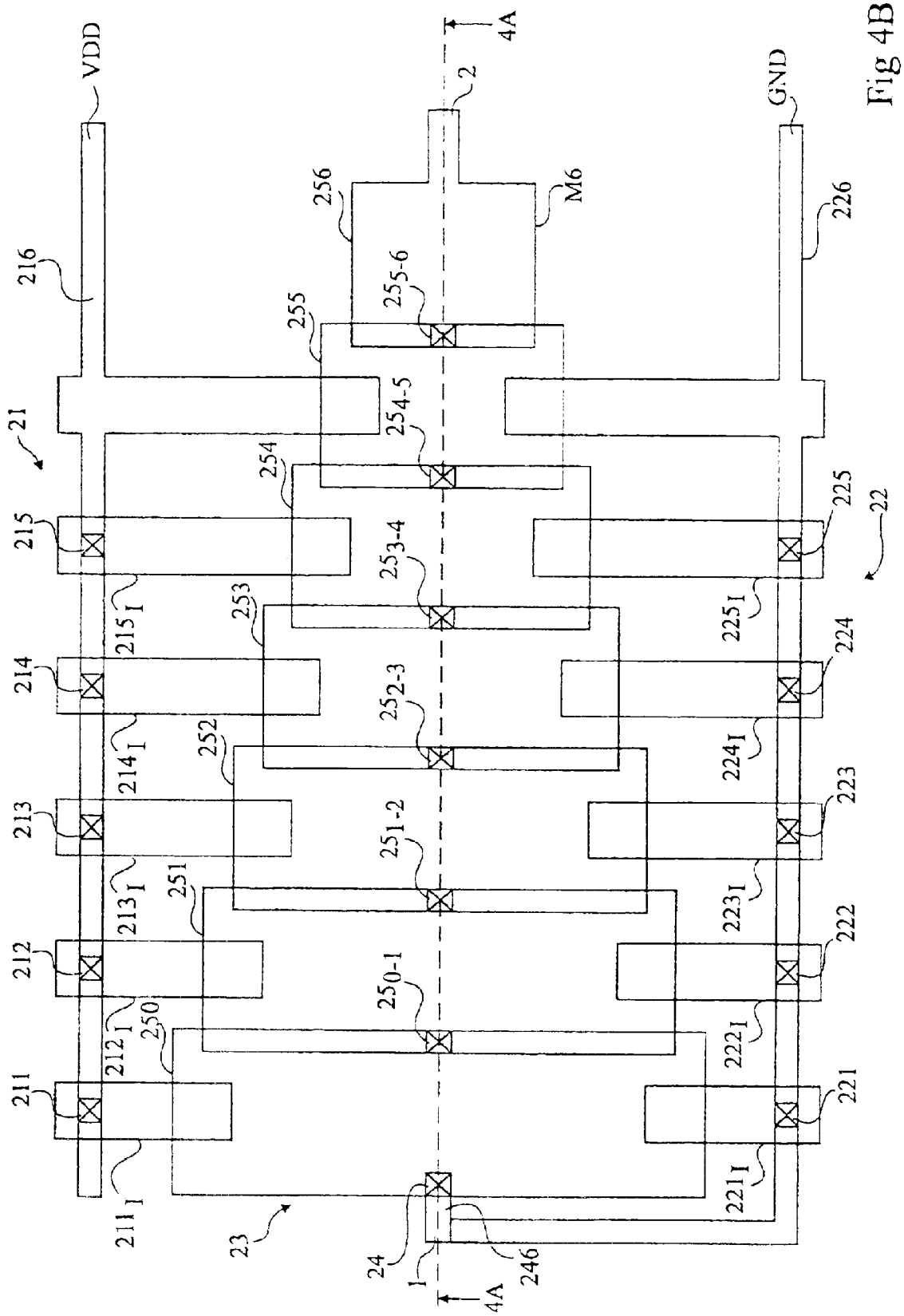
FIG. 4B is a top view of the primary structure of FIG. 4A.

FIGS. 4A and 4B respectively show a cross-section view and a top view of a primary structure of a memory point according to an embodiment of the present invention. On FIG. 4B, the vias are represented by a square in which a cross is inserted, and the metal areas are represented by a rectangle or any other geometric shape. The structure comprises six metal levels $M_1$ to $M_6$ plus one lower conductive level called $M_0$, for example, made of polysilicon, and one additional via level $v_{0-1}$. The primary structure comprises three assemblies 21, 22, 23 of successive interconnected metal areas and vias. First 21 and second 22 assemblies are respectively connected to high and low terminals VDD and GND of a power supply. The third assembly forms a zigzag 23 between a first end 1 and a second end 2.

First part 24 of zigzag 23, to the left of the drawing, is formed of 7 metal areas 240 to 246, respectively on levels M0 to $M_6$ and six vias $24_{0-1}$ to $24_{5-6}$, respectively on via levels $v_{0-1}$ to $v_{5-6}$, which are superposed. Second part 25 of the zigzag is formed of seven metal areas 250 to 256, respectively on levels $M_0$ to $M_6$, and of six vias $25_{0-1}$ to $25_{5-6}$, respectively on via levels $v_{0-1}$ to $v_{5-6}$. Areas 250 to 256 of the second part of zigzag 25 are represented by rectangles of decreasing sizes. Areas 250 to 256 and vias $25_{0-1}$ to $25_{5-6}$ are arranged in steps from area 250 of metal level $M_0$ to area 256 of metal level $M_6$. Thus, via $25_{0-1}$ is arranged on the right-hand side of area 250 and on the left-hand side of area 251. Similarly, via $25_{1-2}$ is arranged on the right-hand side of area 251 and on the left-hand side of area 252, and so on. Areas 240 and 250 are actually contiguous and form a single area, thus connecting first 24 and second 25 parts of the zigzag.

Each assembly 21, 22 comprises a rectilinear horizontal rail 216, 226 on metal level $M_6$ arranged on either side of the zigzag. Five vertical columns 211 to 215 and 221 to 225 of superposed metal areas and vias are positioned under each rail 216, 226. Each couple of columns 211, 221 to 215, 225 respectively extends on either side of a metal area 250 to 254 to the metallization level above that of metal area 250 to 254. The metal area of the lowest metal level, respectively $211_1$ to $215_1$ and $221_1$ to $225_1$ of each of the columns has an elongated shape to cover a portion of metal area 250 to 254 adjacent to the metal level just below. Thus, lower area $211_1$ of column 211 of metal level $M_1$ is elongated to cover a portion of area 250 of the zigzag. Rails 216, 226 each have an elongated portion to respectively cover a portion of area 255 on metal level $M_5$ of the second part of the zigzag. The different columns connected to VDD, GND are thus of decreasing sizes from left to right in FIG. 4A. It is thus possible to connect zigzag 23 to one of the first 21 and second 22 assemblies by adding a single via between one of areas 250 to 255 and a lower area of one of the columns.

The primary structure illustrated in FIGS. 4A and 4B is provided to easily be able to associate several structures next to one another, by juxtaposing the right-hand portion of area 256 of a zigzag to the left-hand portion of area 246 of the next zigzag. In this case, rails 216, 226 at VDD, GND of the successive primary structures juxtapose to form a single rail VDD respectively connected to VDD and to GND.

Figure 5A:
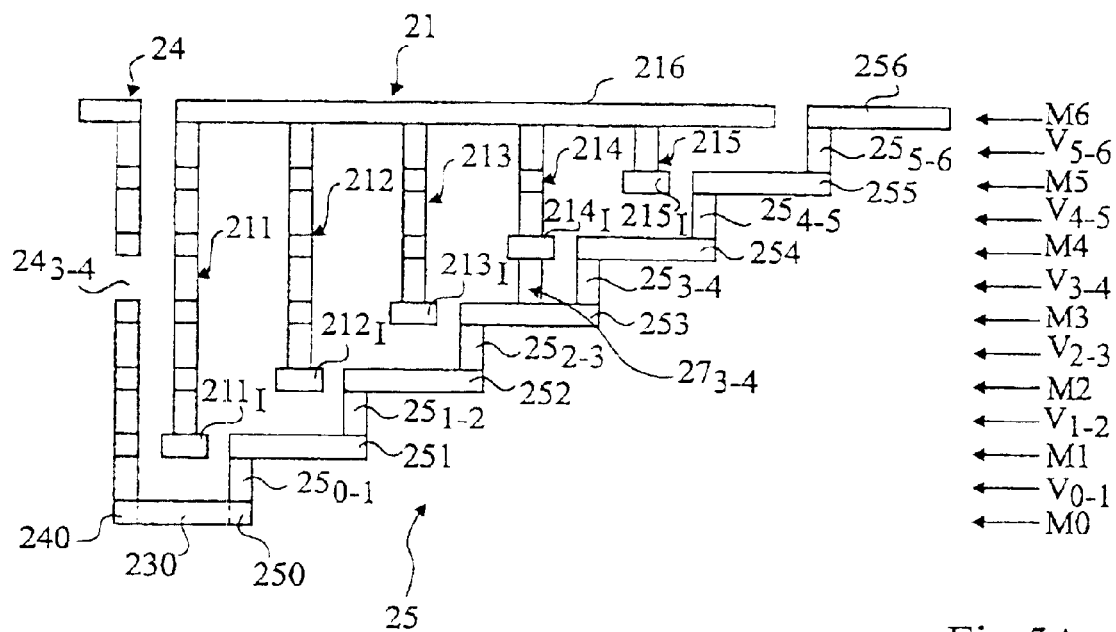
FIG. 5A illustrates the programming by modification of a via level of the primary structure of FIG. 4A.
Figure 5B:
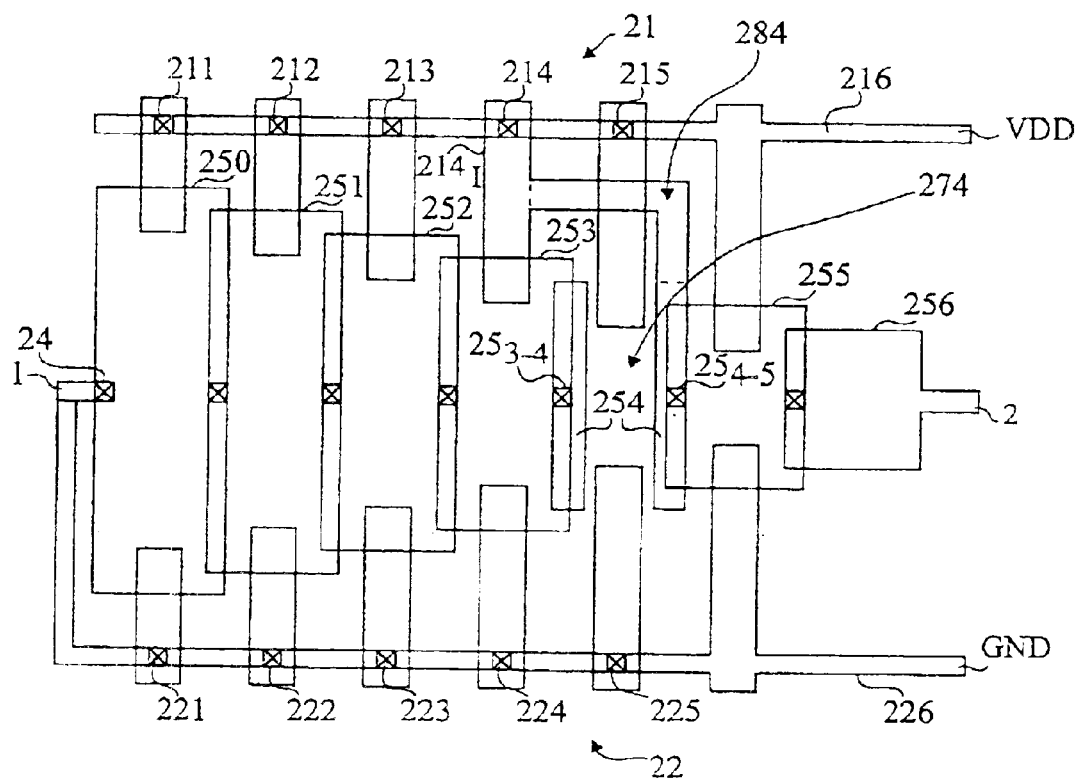
FIG. 5B illustrates the programming by modification of a metal level of the primary structure of FIG. 4B.

FIGS. 5A and 5B illustrate a programming of a primary structure of a memory point according to the embodiment described hereabove in relation with FIGS. 4A and 4B.

In FIG. 5A, a programming is performed by modification of via level $v_{3-4}$. Via $24_{3-4}$ of first part 24 of zigzag 23 is suppressed. First assembly 21 (VDD) or second assembly 22 (GND) is connected to second part 25 of zigzag 23 via a via $27_{3-4}$ connecting area 253 of second part 25 of zigzag 23 to lower area $214_1$ of fourth column 214 connected to VDD.

A programming of a memory point according to the embodiment described in FIGS. 4A and 4B may be performed similarly for any via level by removal of a via of column 24 and by addition of a via on the same via level between zigzag 23 and one of the columns (or the rail for via level $v_{5-6}$).

In FIG. 5B, a programming to VDD is performed by modification of metal level $M_4$. A cut 274 in area 254 of second part 25 of zigzag 23 is performed between vias $26_{3-4}$ and $25_{3-4}$. A connection 284 is performed between the portion of area 254 connected to via $25_{4-5}$ and lower area $214_1$ of fourth column 214 of first assembly 21 defined on metal level $M_4$. A programming to GND would have included a connection between the portion of area 254 connected to via $25_{4-5}$ and lower area $224_1$ of fourth column 224 connected to rail 226 (GND) defined on metal level M4.

The programming of a memory point according to the embodiment described in FIGS. 4A and 4B may be performed similarly for any metal level by cut in a metal area 250 to 256 of zigzag 23 and by addition of a metal area, on this same metal level, between zigzag 23 and the lower portion of one of the columns of the first or of the second assembly (or one of rails 216, 226 for metal area 256).

Figure 6A:
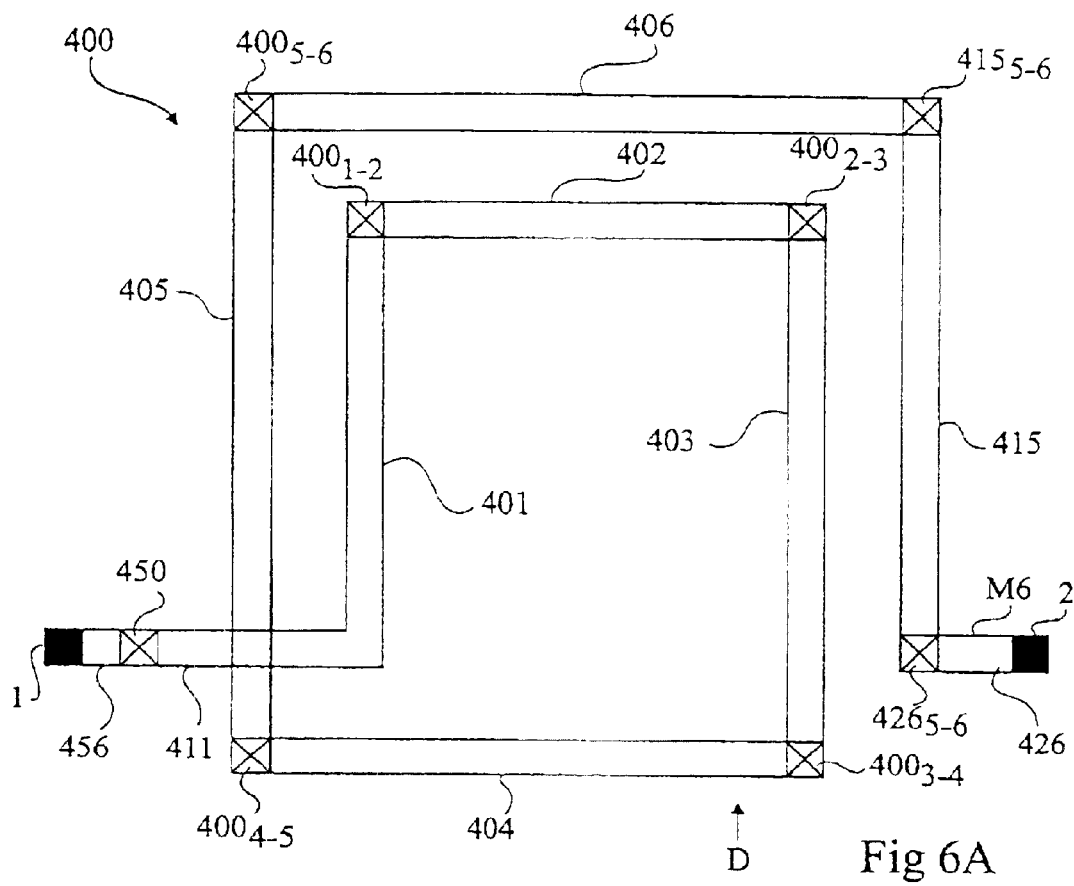
FIG. 6A is a top view of a primary memory point structure according to another embodiment of the present invention.
Figure 6B:
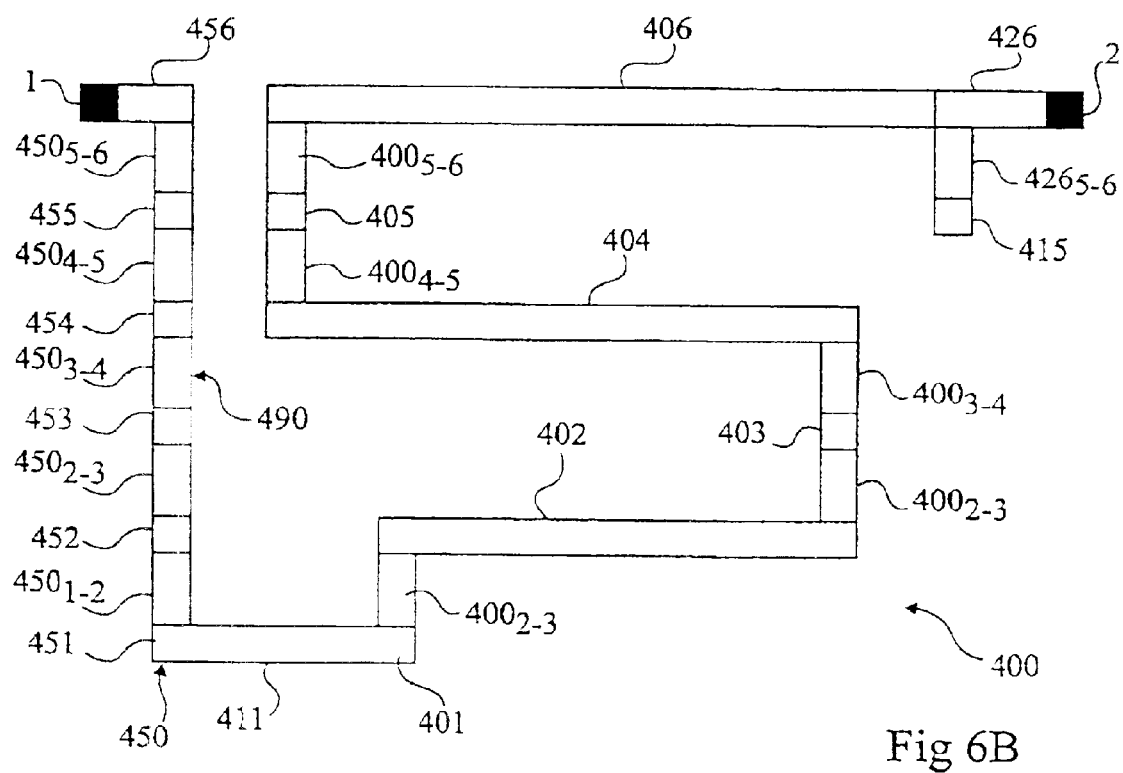
FIG. 6B is a cross-section view of the primary structure of FIG. 6A.

FIGS. 6A and 6B respectively show a top view and a cross-section view along direction D of a primary structure 400 of a memory point according to another embodiment of the present invention. The primary structure comprises first, second, and third assemblies of interconnected areas and vias. Only the third assembly forming a zigzag, between a first end 1 and a second end 2, is shown. A first part of the zigzag is a column 450 of vias $450_{1-2}$ to $450_{5-6}$, respectively formed on via levels $v_{1-2}$ to $v_{5-6}$, and of metal areas 451 to 456, respectively formed on metal levels $M_1$ to $M_6$, superposed, upper area 456 of column 450 being connected to first end 1 of the zigzag.

A second part of the zigzag comprises six rectilinear metal areas 401 to 406, respectively, on metal levels $M_1$ to $M_6$, connected by vias $400_{1-2}$ to $400_{5-6}$, respectively formed on via levels $v_{1-2}$ to $v_{5-6}$ and forming a spiral between levels $M_1$ and $M_6$. This spiral is placed to the right of column 450. In FIG. 6A, areas 405, 401 and 403 are represented by vertical strips and are respectively arranged from left to right. Areas 404, 402 and 406 are represented by horizontal strips and respectively arranged from bottom to top. The top of area 401 is connected to the left-hand portion of rectilinear area 402 by a via $400_{1-2}$. The right-hand portion of area 402 is connected to high part of area 403 by a via $400_{2-3}$. The, low portion of area 403 is connected to the right-hand portion of area 404 by a via $400_{3-4}$. The left-hand portion of area 404 is connected to the low portion of area 405 by a via $400_{4-5}$. The high portion of area 405 is connected to the left-hand portion of area 406 by a via $400_{5-6}$. The right-hand portion of area 406 is connected by a via $415_{5-6}$, formed in via level $v_{5-6}$, to the high portion of a rectilinear vertical area 415 on metal level $M_5$. The low portion of area 415 is connected by a via $426_{5-6}$, formed in via level $v_{5-6}$, to the left-hand portion of a horizontal rectilinear area 426 on metal level $M_6$, itself connected to second end 2 of the zigzag. Area 401 on metal level $M_1$ extends downwards by a rectilinear and horizontal area 411 to form a connection with the lower area of column 450. Areas 456 and 426 are aligned to easily abut two zigzags of the primary structures.

Figure 6C:
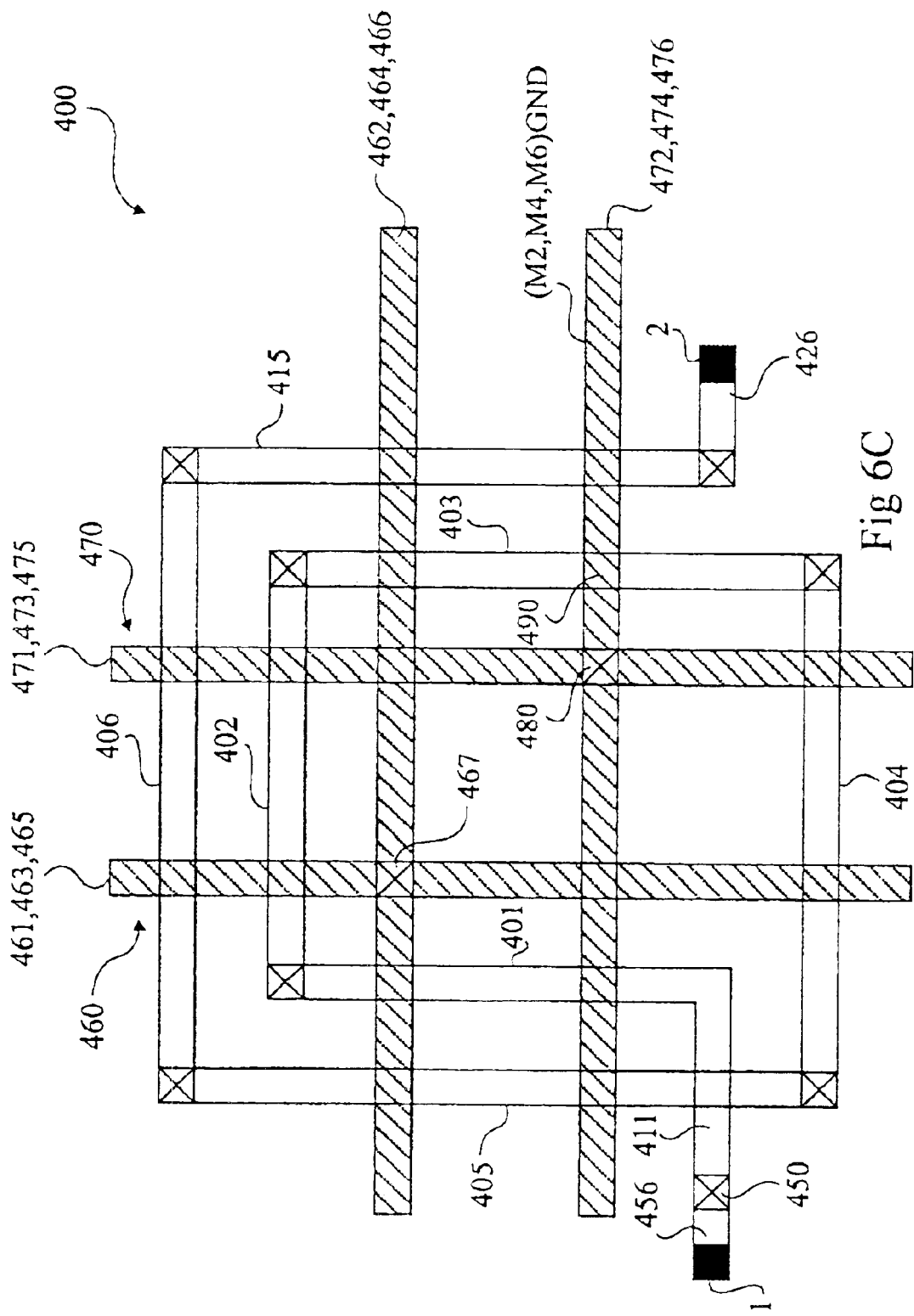
FIG. 6C is a top view comprising supply rails VDD and GND of the structure of FIG. 6A.

FIG. 6C is a more detailed top view of the primary structure illustrated in FIG. 6A. In this drawing, elements analogous to those of FIG. 6A are designated by same reference numerals. First 460 and second 470 assemblies of areas and of vias respectively connected to VDD and to GND are added. First assembly 460, connected to VDD, is formed of three vertical rectilinear metal areas 461, 463, 465, respectively on metal levels $M_1$, $M_3$, $M_5$, and three horizontal rectilinear areas 462, 464, 466, respectively on metal levels $M_2$, $M_4$, $M_6$. The six areas 461 to 466 are connected by vias forming a column 467. The three vertical areas 461, 463, 465 are superposed and insert between vertical areas 401 and 403 of the zigzag and run above or under areas 402, 404 and 406 of the zigzag. The three other areas 462, 464 and 466 are superposed and insert between line 402 and lines 426, 404 and 411 and run above or under areas 401, 403, 405 and 415.

Similarly, second assembly 470, connected to GND, is formed of three vertical rectilinear metal areas 471, 473, 475 respectively on metal levels $M_1$, $M_3$, $M_5$ and of three horizontal rectilinear metal areas 472, 474, 476, respectively on metal levels $M_2$, $M_4$, and $M_6$. The six areas are connected by vias forming a column 480. The three vertical areas 471, 473 and 475 are superposed and inserted between areas 401, 403, and 405 and run above or under areas 402, 404 and 406 of the zigzag. The three horizontal areas 472, 474, 476 are inserted between areas 402 and 406 and horizontal areas 411, 426 and 404 and run above or under areas 401, 403, 405 and 415.

A programmation of a primary structure, such as that illustrated in relation with FIG. 6C, may be performed by modification of a via level or of a metal level. A programming by a via level is carried out by removing a via in column 450 and by adding a via, on the same via level, which connects first assembly 460 (VDD) or second assembly 470 (GND) and one of areas 401 to 406 of the zigzag. Thus, a programming to GND on via level $v_{3-4}$ is performed by removing via $450_{3-4}$ of column 450 and by adding a via between area 403 of the zigzag and area 474 of second assembly 470 (GND) at the level of region 490 of superposition of the two areas 403, 474.

A programming by modification of a metal level $M_k$ is performed by cutting one of areas 401 to 406 of the zigzag defined on this same metal level $M_k$ in two pieces. The piece connected to second end 2 of the zigzag is connected to first assembly 460 (VDD) or to second assembly 470 (GND) by addition of an area on the same metal level $M_k$. Thus, a programming to VDD on metal level M5 is carried out by cutting area 405 and connecting the upper part of area 405 connected to second end 2 to area 465 of first assembly 460 (VDD).

An advantage of a memory point according to the present invention is that the programmed value may be changed for each new version that requires a modification of any metal or via level.

Of course, the present invention is likely to have various alterations, modifications, and improvements which will readily occur to those skilled in the art. In particular, first 110 and second 120 rails of the memory point may be connected to internal or external terminals of the circuit.

The first rail of the memory point according to the present invention and the zigzag may, for example, be connected to the source of a transistor used as a memory point of a ROM (the gate and the drain of the transistor being connected to an access line and column). The transistor source may be at the voltage applied to the second rail, by connecting the zigzag to the second rail, or in high impedance by not connecting the zigzag. This enables reprogramming a ROM upon modification of any metal or via level, conversely to current ROMs which are modifiable by alteration of a determined metal level.

Further, a memory point according to the present invention may comprise multiple rails at different voltage levels. The memory point may be programmed to different values by connecting the zigzag to one of the rails.

Moreover, the number of metal levels used may be adapted according to the circuit. Further, many embodiments of a memory point according to the present invention may be imagined. Further, the number of primary structures forming the memory point will be defined for each application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory element in an integrated circuit comprising several levels of conductive materials separated by insulating levels, each of which is capable of being crossed by conductive vias of an intercalary via level, and at least two connection rails, and comprising several assemblies of successive interconnected areas and vias, a first assembly being formed of a zigzag running from a first metal level to a last metal level and back to the first metal level between a first end and a second end, each of the other assemblies being connected to one of the connection rails, the first end of the zigzag being connected to a second assembly among the other assemblies.

2. The memory element of claim 1, wherein:

a first part of the zigzag is formed of i+1 metal areas and of i vias superposed between the first and last metal levels, the upper area on the upper metal level being connected to the first end, wherein i is a positive integer of at least 2, and a second stepped part of the zigzag is formed of i+1 metal areas and of i vias between the first and last metal levels, two vias on consecutive via levels being arranged on either side of the area defined on the intermediary metal level, the upper area being connected to the second end of the zigzag, the lower areas, on the last metal level, of the first and second parts of the zigzag being connected, and in which the second and a third assemblies are arranged on either side of the zigzag and are both formed of i–1 columns of decreasing sizes formed of areas and vias superposed between the first metal level and a metal level, from the second to the i-th metal level, the i–1 lower areas of each column covering a portion of the i–1 areas of the second part of the zigzag respectively defined on the metal levels ranging from last metal level to the second metal level, the i−1 columns being connected together by one of the connection rails defined on the first metal level, the upper area of the first part of the zigzag being connected to the rail of the second or of the third assembly.

3. The memory element of claim 1, wherein a first part of the zigzag is formed of a column of areas and of vias superposed between the first and last metal levels, the upper area being connected to the end of the first zigzag, a second part of the zigzag is formed of i+1 rectilinear metal areas defined on all metal levels, from the first to the last, and of i vias defined on all via levels, connected together to the shape of an ascending spiral, wherein i is a positive integer of at least 2, the rectilinear areas defined on the even metal levels being oriented according to a first direction, those defined on the odd metal levels being oriented according to a second direction perpendicularly to the first direction, the upper area of the second part of the zigzag being connected to the second end of the zigzag, the lower areas, on the first metal level, of the first and second parts of the zigzag being connected, and in which second and third assemblies are both formed of first superposed rectilinear rails defined on each of the even metal levels and oriented according to the first direction, and of second superposed rectilinear rails defined on each of the odd metal levels and oriented according to the second direction, the first and second rails of a same assembly being connected by vias, the rails oriented according to the first or the second direction respectively passing under or over the areas of the second part of the zigzag respectively oriented according to the second or to the first direction.

4. A memory element in an integrated circuit comprising several levels of conductive materials separate by insulating levels, each of which is capable of being crossed by conductive vias of an intercalary via level, and at least two connection rails, and comprising several assemblies of successive interconnected areas and vias, first and second assemblies being each formed of one or two stacks of areas and vias, the first and second assemblies having together the form of a cut zigzag going from a first end to a second end, each of the other assemblies being connected to one of the connection rails, the first assembly being connected to a third assembly among the other assemblies and the second assembly being connected to a fourth assembly among the other assemblies.

5. The memory element of claim 4, wherein:

the first assembly is a column of n+1 metal areas and n vias superposed between an intermediate metal level and a first metal level, the upper area on the upper metal level being connected to the first end, wherein n is a non-negative integer, and the second assembly comprises a stepped stack formed of i+1 metal areas and i vias between the first and last metal levels, two vias on consecutive via levels being arranged on either side of the area defined on the intermediary metal level, the upper area being connected to said second end, wherein i is a positive integer of at least 2 and greater than n, and a column of i−n metal areas and i−n−1 vias superposed between the least metal level and a metal level placed directly under said intermediate level, the lower area of the column being connected to the lower area of the stepped stack, the column of the first assembly being placed above the column of the second assembly, in which the third and the fourth assemblies are arranged on either side of the cut zigzag formed by the first and the second assemblies, and are both formed of i−1 columns of decreasing sizes formed of areas and vias superposed between the first metal level and a metal level, from the second to the i-th metal level, the i−1 lower areas of each column covering a portion of the i−1 areas of the stepped stack of the second assembly respectively defined on the metal levels ranging from the last metal level to the second metal level, the i−1 columns being connected together by one of the connection rails defined on the first metal level, wherein the upper area of the first assembly is connected to the rail of the third assembly, and the second assembly is connected to the fourth assembly by an additional via placed between one of the areas of the second assembly and the lower area of one of the columns of the fourth assembly covering said area of the second assembly.

6. The memory element of claim 4, wherein:

a first assembly comprises:

a column of i+1 areas and i vias superposed between the first and the last metal level, the upper area on the upper metal level being connected to the said first end, wherein i is a positive integer of at least 2, and a stepped stack formed of n+1 metal areas and n vias between the last and an intermediate metal level, two vias on consecutive via levels being arranged on either side of the area defined on the intermediary metal level, the lower area of the column being connected to the lower area of the stepped stack, wherein n is a non-negative integer less than i, and the second assembly is a stepped stack formed on i−n+1 metal areas and i-n vias between said intermediate metal level and the first metal level, two vias on consecutive via levels being arranged on either side of the area defined on the intermediary metal level, the upper area being connected to said second end, in which the third and the fourth assemblies are arranged on either side of the cut zigzag formed by the first and the second assemblies, and are both formed of i−1 columns of decreasing sizes formed of areas and vias superposed between the first metal level and a metal level, from the second to the i-th metal level, the i−1 lower areas of each column covering a portion of the areas of the stepped stacks of the first and second assemblies respectively defined on the metal levels ranging from the last metal level to the second metal level, the i−1 columns being connected together by one of the connection rails defined on the first metal level, wherein the upper area of the column of the first assembly is connected to the rail of the third assembly, and the second assembly is connected to the fourth assembly by an additional area placed between the area of the second assembly on said intermediate metal level and the lower area of one of the columns of the fourth assembly on said intermediate metal level.

7. The memory element of claim 4, wherein:

the first assembly is formed of a column of n+1 areas and of n vias superposed between a first intermediate metal level and the first metal level, the upper area being connected to the said first end, wherein n is a non-negative integer, the second assembly comprises a first part formed of i+1 rectilinear metal areas defined on all metal levels, from the first to the last, and of i vias defined on all via levels, connected together to the shape of an ascending spiral, the rectilinear areas defined on the even metal levels being oriented according to a first direction, those defined on the odd metal levels being oriented according to a second direction perpendicularly to the first direction, the upper area of the first part being connected to the said second end, wherein i is a positive integer of at least 2 and greater than n, and a second part formed of a column of i−n areas and of i−n−1 vias superposed between the first metal level and a second intermediate metal level placed immediately under said first intermediate metal level, the lower areas of first and second parts being connected on the first metal level, and in which the third and the fourth assemblies are both formed of first superposed rectilinear rails defined on each of the even metal levels and oriented according to the first direction, and of second superposed rectilinear rails defined on each of the odd metal levels and oriented according to the second direction, the first and second rails of a same assembly being connected by vias, the rails oriented according to the first or the second direction respectively passing under or over the areas of the first part of the second assembly respectively oriented according to the second or to the first direction, and in which the first assembly is connected to one of the first or second rails and the first part of the second assembly is connected by a via to one of the second or first rails.

8. A memory element in an integrated circuit comprising several levels of conductive materials separated by insulating levels, each of which is capable of being crossed by conductive vias of an intercalary via level, and at least two connection rails, and comprising several assemblies of successive interconnected areas and vias, first, second and third assemblies being each formed of one or two stacks of areas and vias the first, second and third assemblies having together the form of a zigzag going from a first end to a second end, the zigzag being cut twice, each of the other assemblies being connected to one of the connection rails, the first assembly being connected to a fourth assembly among the other assemblies, the second assembly being connected to a fifth assembly among the other assemblies, and the third assembly being connected to the fourth assembly.

9. A memory point in an integrated circuit comprising:

a plurality of memory elements in series, a second end of a memory element being connected to a first end of a next memory element, wherein the memory element comprises several levels of conductive materials separated by insulating levels, each of which is capable of being crossed by conductive vias of an intercalary via level, and at least two connection rails, and comprising several assemblies of successive interconnected areas and vias, a first assembly being formed of a zigzag running from a first metal level to a last metal level and back to the first metal level between the first end and the second end, each of the other assemblies being connected to one of the connection rails, the first end of the zigzag being connected to a second assembly among the other assemblies.

10. A memory in an integrated circuit comprising:

one or several memory points, wherein the memory point comprises a plurality of memory elements in series, a second end of a memory element being connected to a first end of a next memory element, wherein the memory element comprises several levels of conductive materials separated by insulating levels, each of which is capable of being crossed by conductive vias of an intercalary via level, and at least two connection rails, and comprising several assemblies of successive interconnected areas and vias, a first assembly being formed of a zigzag running from a first metal level to a last metal level and back to the first metal level between the first end and the second end, each of the other assemblies being connected to one of the connection rails, the first end of the zigzag being connected to a second assembly among the other assemblies.

11. A method for programming a memory point in an integrated circuit comprising several levels of conductive materials separated by insulating levels, each of which is capable of being crossed by conductive vias of an intercalary via level, and at least two connection rails, the memory point comprising at least two assemblies of interconnected areas and vias, a first assembly being formed of n zigzags in series, n being a number greater than or equal to 1, each zigzag running from a first metal level to a last metal level and back to the first metal level between a first end and a second end, the second end of each zigzag being connected to the first end of the next zigzag, each of the other assemblies being connected to one of the connection rails, the first end of the first zigzag being connected to an initial assembly selected from among the other assemblies, and comprising:

a first programming at the level of the first zigzag in two steps:

cutting the zigzag in two parts, and connecting the zigzag part connected to the second end to one of the other assemblies different from the initial assembly;

a second programming at the level of the second zigzag or possibly of the first zigzag in two steps:

a cutting the zigzag in two parts, and connecting the zigzag part connected to the second end to one of the other assemblies different from that used for the previous programming;

successive programming of one or several zigzags, up to the n-th zigzag according to the second programming.

* * * * *